(12) United States Patent
Jung

(10) Patent No.: US 7,642,119 B2
(45) Date of Patent: Jan. 5, 2010

(54) METHOD FOR MANUFACTURING IMAGE SENSOR

(75) Inventor: Chung Kyung Jung, Anyang-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/250,008

(22) Filed: Oct. 13, 2008

(65) Prior Publication Data
US 2009/0117682 A1    May 7, 2009

(30) Foreign Application Priority Data
Nov. 5, 2007   (KR) .................. 10-2007-0112156

(51) Int. Cl.
H01L 21/00   (2006.01)
(52) U.S. Cl. .............................. 438/69; 438/64; 438/71
(58) Field of Classification Search .................. 438/57, 438/64, 65, 66, 69, 70, 71, 72
See application file for complete search history.

(56) References Cited

U.S. PATENT DOCUMENTS

| | | | |
|---|---|---|---|
| 6,586,811 B2 * | 7/2003 | Sekine | 257/432 |
| 6,753,557 B2 * | 6/2004 | Nakai | 257/233 |
| 7,420,236 B2 * | 9/2008 | Hashimoto | 257/294 |
| 2007/0200056 A1 * | 8/2007 | Kim et al. | 250/216 |
| 2008/0315341 A1 * | 12/2008 | Lee | 438/70 |
| 2009/0032895 A1 * | 2/2009 | Park | 438/70 |

FOREIGN PATENT DOCUMENTS

| | | |
|---|---|---|
| KR | 10-2003-0002874 | 1/2003 |
| KR | 10-2005-0057968 | 6/2005 |

* cited by examiner

Primary Examiner—Kevin M Picardat
(74) Attorney, Agent, or Firm—Saliwanchik, Lloyd & Saliwanchik

(57) ABSTRACT

A method for manufacturing an image sensor is provided. The method can include forming an oxide layer on a color filter layer, forming a first oxide layer microlens by etching the oxide layer, forming a second oxide layer microlens on the first oxide layer microlens, and forming a third oxide layer microlens on the second oxide layer microlens.

19 Claims, 2 Drawing Sheets

METHOD FOR MANUFACTURING IMAGE SENSOR

CROSS-REFERENCE TO RELATED APPLICATION

The present application claims the benefit under 35 U.S.C. §119 of Korean Patent Application No. 10-2007-0112156, filed Nov. 5, 2007, which is hereby incorporated by reference in its entirety.

BACKGROUND

According to the related art, in order to form a microlens in the process of manufacturing an image sensor, a micro-photo process is typically performed by using a photoresist for the microlens and then performing a reflowing process.

However, a large amount of photoresist is lost during the reflowing process, thereby forming a gap between adjacent microlenses. As a result, the amount of light introduced into a photodiode is reduced, leading to an image defect for the image sensor.

In addition, according to the related art, in the case of a microlens formed using organic material, particles generated when a wafer sawing process is performed (e.g., a package process or a bump process in a semiconductor chip mounting process) may cause damage to the microlens. In addition, image defects may be caused if the particles adhere to the microlens.

Moreover, according to the related art, when the microlens is manufactured, a difference in focal length often occurs between a cross axis and a diagonal axis, leading to crosstalk in adjacent pixels.

Accordingly, there exists a need in the art for an improved method for manufacturing an image sensor.

BRIEF SUMMARY

Embodiments of the present invention provide methods for manufacturing an image sensor capable of reducing gaps between adjacent microlenses by forming the microlens using an oxide layer rather than organic material.

In an embodiment, a method for manufacturing an image sensor can include: forming an oxide layer on a color filter layer; etching the oxide layer to form a first oxide layer microlens; forming a second oxide layer microlens on the first oxide layer microlens; and forming a third oxide layer microlens on the second oxide layer microlens. A chemical process can be performed with respect to the second oxide layer microlens.

DETAILED DESCRIPTION

Hereinafter, methods for manufacturing an image sensor according to embodiments of the present invention will be described in detail with reference to accompanying drawings.

When the terms "on" or "over" or "above" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

Figure 1:
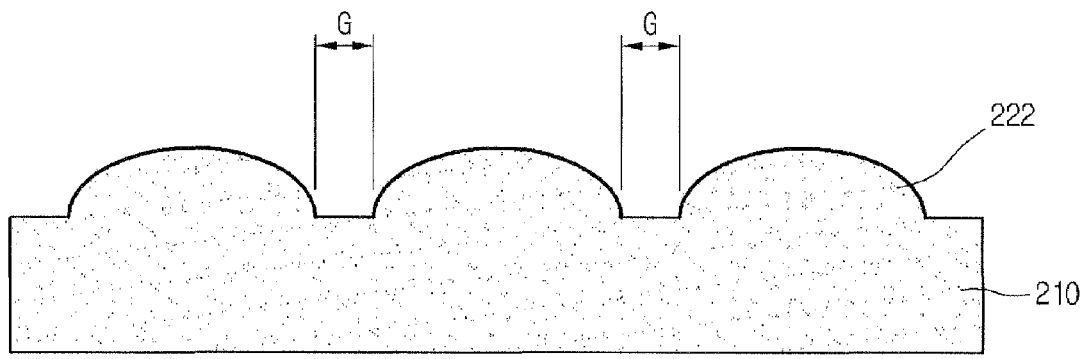
FIGS. 1 to 3 are cross-sectional views showing a process for manufacturing an image sensor according to an embodiment of the present invention.
Figure 2:
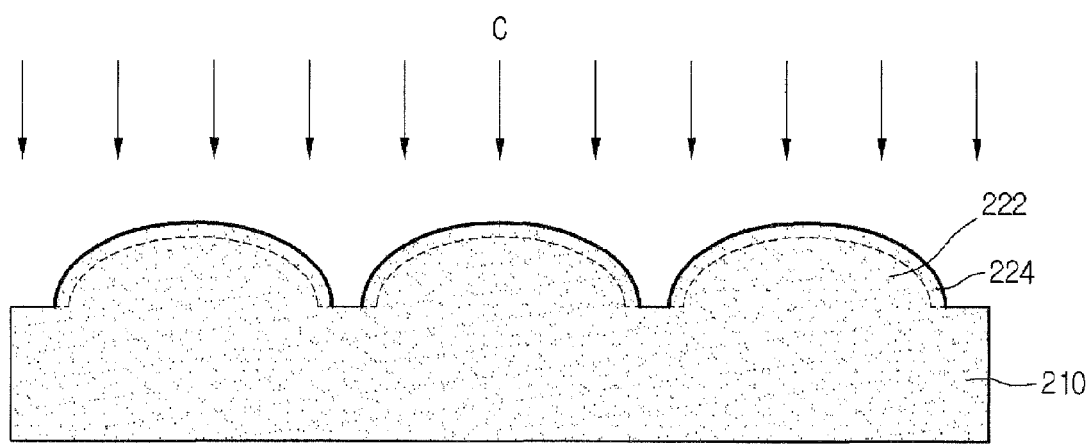
Figure 3:
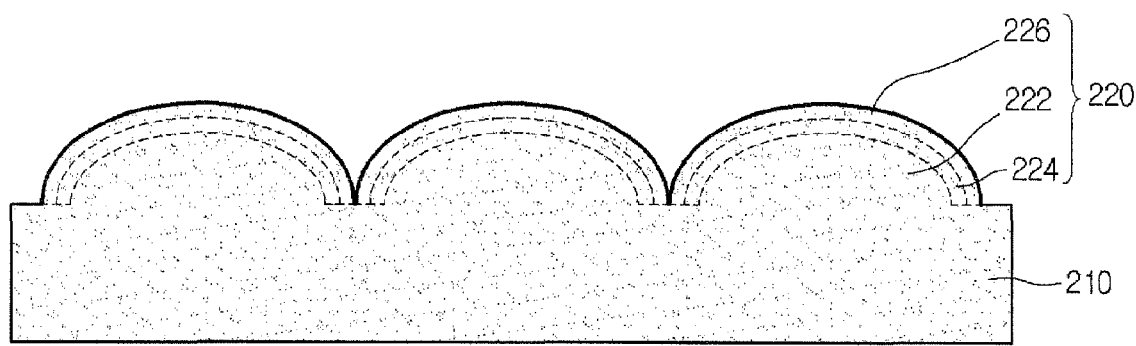

FIGS. 1 to 3 are cross-sectional views showing a process for manufacturing an image sensor according to an embodiment of the present invention.

A photodiode (not shown) and a circuitry (not shown) can be formed on a substrate (not shown), and an interlayer dielectric layer (not shown) can be formed on the photodiode.

In certain embodiments, the interlayer dielectric layer may be provided in the form of a multi layer. In one embodiment, two interlayer dielectric layers can be provided, in which a light blocking layer is formed on a first interlayer dielectric layer to inhibit light from being introduced into a region other than a photodiode region, and then a second interlayer dielectric layer can be formed on the light blocking layer.

A passivation layer (not shown) for protecting against moisture and scratch can be formed on the interlayer dielectric layer.

Then, a dyeable photoresist can be coated on the interlayer dielectric layer, and an exposure and development process can be performed, thereby forming red (R), green (G), and blue (B) color filter layers (not shown).

A planarization layer (not shown) can be formed on the color filter layer to adjust a focal length and to provide a planar layer for forming a lens layer.

Then, referring to FIG. 1, an oxide layer 210 can be formed on the planarization layer (not shown).

In an embodiment, the oxide layer 210 can be formed by depositing an oxide film at a temperature of about 200° C. or below. The oxide layer 210 can be formed of any suitable oxide known in the art, for example, silicon dioxide ($SiO_2$). Additionally, the oxide layer 210 can be formed by any suitable process known in the art, for example, a Chemical Vapor Deposition (CVD), a Physical Vapor Deposition (PVD), or a Plasma-Enhanced Chemical Vapor Deposition (PECVD). In an embodiment, the oxide layer 210 can be deposited to a thickness of about 700 nm to about 800 nm.

A plurality of photoresist patterns (not shown) spaced apart from each other by a predetermined interval can be formed on the oxide layer 210. For example, the photoresist patterns can be formed by coating photoresist (not shown) for a microlens on the oxide layer 210 and selectively patterning the photoresist through an exposure and development process using a mask (not shown) for microlenses.

At this time, the photoresist pattern can have a thickness larger than that of the oxide layer 210.

In an embodiment, the oxide layer 210 can be etched by using the photoresist pattern as an etching mask using etching conditions such that the oxide layer 210 can form with curvature, for example, by performing the etching process while tilting the substrate.

In an alternative embodiment, the photoresist pattern can be subjected to a reflowing process to form a microlens pattern, and the oxide layer 210 can be etched using the microlens pattern as an etching mask. For example, the substrate, on which the photoresist pattern is formed, can be mounted on a hot plate (not shown) and subjected to a heat treatment at a temperature of at least about 150° C., such that the photoresist pattern reflows to form the microlens pattern having a hemispherical shape.

Here, the microlens pattern can have a thickness larger than that of the oxide layer 210.

Thus, the oxide layer 210 is etched using either the photoresist pattern or the microlens pattern as an etching mask to form a first oxide layer microlens 222. The first oxide layer microlens 222 can have a predetermined curvature.

During the etching process performed using the microlens pattern as an etching mask, a gap G can be formed between the first oxide layer microlens 222 and an adjacent first oxide layer microlens.

In an embodiment, a microlens can be formed by using an oxide layer other than organic material, and a chemical treatment (described in more detail below) can be performed on the oxide layer microlens to reduce surface roughness and the gap G between the microlenses. Accordingly, product yield and reliability of the microlens can be improved.

Referring to FIG. 2, a second oxide layer microlens 224 can be formed on the first oxide layer microlens 222. In an embodiment, a low temperature oxide layer having a thickness of from about 100 nm to about 300 nm can be deposited to form the second oxide layer microlens 224.

After forming the second oxide layer microlens 224, a chemical treatment C can be performed on the second oxide layer microlens 224. In an embodiment, the chemical treatment C can use chemicals including tetramethylammonium hydroxide (TMH), hydrogen peroxide ($H_2O_2$), and water ($H_2O$). For example, the chemicals can include TMH, $H_2O_2$, and $H_2O$ mixed in a vol ratio of 1:1.5 to 2.3:20 to 36.7, such that there is about 1.5 to about 2.3 times as much $H_2O_2$ as TMH and about 20 to about 36.7 times as much $H_2O$ as TMH.

The chemical treatment can be applied to the second oxide layer microlens 224 to reduce the surface roughness and inhibit oxide loss. If the chemical treatment is performed with the chemicals having a vol ratio of TMH:$H_2O_2$:$H_2O$ of about 1:1.5 to 2.3:20 to 36.7, the it is possible to decrease the required amount of chemicals and process time. That is, if the chemical treatment is performed using such a ratio for about 1 minute to about 5 minutes, particles remaining on a surface of the second oxide layer microlens 224 can be removed and the surface roughness can be reduced. If the treatment time is less than 1 minute, the particles may not be removed, and if the treatment time is more than 5 minutes, the chemical treatment can result in saturation.

Referring to FIG. 3, a third oxide layer microlens 226 can be formed on the second oxide layer microlens 224. In an embodiment, the third oxide layer microlens 226 can be deposited to a thickness of about 100 nm to about 300 nm. Thus, the oxide layer microlens 220 can be obtained, including the first oxide layer microlens 222, the second oxide microlens 224, and the third oxide layer microlens 226.

According to embodiments of the present invention, since the third oxide layer microlens 226 can be formed on the second oxide layer microlens 224, the surface roughness of the microlens can be improved compared to that of a single microlens having a thickness corresponding to the sum of the thickness of the second oxide layer microlens 224 and the third oxide layer microlens 226.

Additionally, according to embodiments, two or more deposition processes can be performed, leading to an improved aspect ratio and reduced-gap or gap-free oxide layer microlens.

In methods for manufacturing an image sensor according to embodiments of the present invention, the microlens can include an oxide layer instead of organic material. In addition, the oxide layer microlens can be formed through several steps, and a chemical treatment can be performed on the oxide layer microlens, so that the surface roughness can be reduced and the gaps between microlenses can be reduced or even removed completely. Accordingly, the product yield and reliability of the microlens can be improved Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
    forming an oxide layer on a color filter layer;
    etching the oxide layer to form a first oxide layer microlens;
    forming a second oxide layer microlens on the first oxide layer microlens;
    performing a chemical treatment on the second oxide layer microlens; and
    forming a third oxide layer microlens on the second oxide layer microlens after performing the chemical treatment.

2. The method according to claim 1, wherein performing the chemical treatment comprises applying a chemical to the second oxide layer microlens, wherein the chemical comprises TMH, $H_2O_2$ and $H_2O$.

3. The method according to claim 2, wherein etching the oxide layer comprises using a photoresist pattern as an etching mask.

4. The method according to claim 2, wherein etching the oxide layer to form the first oxide layer microlens comprises:
    depositing a photoresist pattern on the oxide layer;
    forming a microlens pattern by performing a reflow process on the photoresist pattern; and
    etching the oxide layer using the microlens pattern as an etching mask.

5. The method according to claim 2, wherein performing the chemical treatment comprises performing the chemical treatment for about 1 minute to about 5 minutes.

6. The method according to claim 2, wherein the chemical comprises about 1.5 to about 2.3 times as much $H_2O_2$ as TMH, and wherein the chemical comprises about 20 to about 36.7 times as much $H_2O$ as TMH.

7. The method according to claim 6, wherein performing the chemical treatment comprises performing the chemical treatment for about 1 minute to about 5 minutes.

8. The method according to claim 6, wherein etching the oxide layer comprises using a photoresist pattern as an etching mask.

9. The method according to claim 6, wherein etching the oxide layer to form the first oxide layer microlens comprises:
    depositing a photoresist pattern on the oxide layer;

forming a microlens pattern by performing a reflow process on the photoresist pattern; and etching the oxide layer using the microlens pattern as an etching mask.

10. The method according to claim 1, wherein performing the chemical treatment comprises performing the chemical treatment for about 1 minute to about 5 minutes.

11. The method according to claim 1, wherein etching the oxide layer comprises using a photoresist pattern as an etching mask.

12. The method according to claim 1, wherein etching the oxide layer to form the first oxide layer microlens comprises:

depositing a photoresist pattern on the oxide layer;

forming a microlens pattern by performing a reflow process on the photoresist pattern; and etching the oxide layer using the microlens pattern as an etching mask.

13. The method according to claim 1, wherein etching the oxide layer comprises using a photoresist pattern as an etching mask.

14. The method according to claim 1, wherein etching the oxide layer to form the first oxide layer microlens comprises:

depositing a photoresist pattern on the oxide layer;

forming a microlens pattern by performing a reflow process on the photoresist pattern; and etching the oxide layer using the microlens pattern as an etching mask.

15. The method according to claim 1, wherein forming the oxide layer comprises depositing the oxide layer at a temperature of about 200° C. or less.

16. The method according to claim 1, wherein forming the oxide layer comprises depositing the oxide layer to a thickness of about 700 nm to about 800 nm.

17. The method according to claim 1, wherein forming the second oxide layer microlens comprises forming a second oxide layer on the first oxide layer microlens to a thickness of about 100 nm to about 300 nm.

18. The method according to claim 1, wherein forming the third oxide layer microlens comprises forming a third oxide layer on the second oxide layer microlens to a thickness of about 100 nm to about 300 nm.

19. The method according to claim 1, wherein the second oxide layer microlens comprises a low temperature oxide.

* * * * *